United States Patent
Yun et al.

(10) Patent No.: US 8,008,891 B2
(45) Date of Patent: Aug. 30, 2011

(54) SIMPLE METHOD FOR ACCURATELY DETERMINING A STATE OF CHARGE OF A BATTERY, A BATTERY MANAGEMENT SYSTEM USING SAME, AND A DRIVING METHOD THEREOF

(75) Inventors: Han-Seok Yun, Suwon-si (KR); Young-Jo Lee, Suwon-si (KR); Soo-Seok Choi, Suwon-si (KR); Oan-Yong Nam, Seoul (KR); Bo-Hyung Cho, Seoul (KR)

(73) Assignees: Samsung SDI Co., Ltd., Gongse-dong, Giheung-gu, Yongin-si, Gyeonggi-do (KR); SNU R & DB Foundation, Seoul (KR)

( * ) Notice: Subject to any disclaimer, the term of this patent is extended or adjusted under 35 U.S.C. 154(b) by 887 days.

(21) Appl. No.: 11/797,766

(22) Filed: May 7, 2007

(65) Prior Publication Data

US 2007/0299620 A1    Dec. 27, 2007

(51) Int. Cl.
   *H01M 10/46* (2006.01)
(52) U.S. Cl. .................................................. 320/132
(58) Field of Classification Search .............. 320/107, 320/114, 132, 149
   See application file for complete search history.

(56) References Cited

U.S. PATENT DOCUMENTS

| | | | |
|---|---|---|---|
| 2002/0036481 A1 | 3/2002 | Nagase | |
| 2004/0129478 A1* | 7/2004 | Breed et al. | 180/273 |
| 2005/0057255 A1 | 3/2005 | Tate, Jr. et al. | |
| 2005/0160316 A1* | 7/2005 | Shipton | 714/22 |
| 2006/0100833 A1 | 5/2006 | Plett | |

FOREIGN PATENT DOCUMENTS

| | | |
|---|---|---|
| JP | 2006105821 A | 4/2006 |
| JP | 2008519977 A | 6/2008 |
| KR | 2003-0038992 | 5/2003 |
| KR | 2005-0019856 | 3/2005 |

OTHER PUBLICATIONS

European Search Report corresponding to European Patent Application No. 07111015.9, Issued on Sep. 19, 2007.

Japanese Office Action issued by JPO, dated Jan. 19, 2011, corresponding to Japanese Patent Application No. 2007-152766, together with Request for Entry.

* cited by examiner

*Primary Examiner* — Edward Tso
(74) *Attorney, Agent, or Firm* — Robert E. Bushnell, Esq.

(57) ABSTRACT

A battery management system using a measurement model modeling a battery, and estimating a SOC (state-of-charge) of the battery, and a battery driving method thereof. The battery management system is constructed with a sensor, a predictor, a data rejection unit, and a measurement unit. The sensor senses a charging and discharging current flowing through the battery, a temperature of the battery, a terminal voltage of the battery. The predictor counts the charging and discharging current, and estimates the state-of-charge of the battery. The data rejection unit generates information associated with an error generated from the measurement model, as a function of at least one of the battery temperature, the charging and discharging current, the state-of-charge, and a dynamic of the charging and discharging current. The measurement unit corrects the estimated state-of-charge of the battery, using the measurement model and the information associated with the error.

42 Claims, 7 Drawing Sheets

SIMPLE METHOD FOR ACCURATELY DETERMINING A STATE OF CHARGE OF A BATTERY, A BATTERY MANAGEMENT SYSTEM USING SAME, AND A DRIVING METHOD THEREOF

CLAIM OF PRIORITY

This application makes reference to, incorporates the same herein, and claims all benefits accruing under 35 U.S.C. §119 from an application for METHOD FOR ESTIMATING STATE OF CHARGE OF BATTERY BATTERY MANAGEMENT SYSTEM USING SAME, AND DRIVING METHOD THEREOF earlier filed in the Korean Intellectual Property Office on 26 Jun. 2006 and there duly assigned Serial No. 10-2006-0057521.

BACKGROUND OF THE INVENTION

1. Field of the Invention

The present invention relates to a device and method for determining a state of charge (SOC) of a battery. More particularly, the present invention relates to a battery management system for estimating a state such as a SOC using an adaptive filter, and a driving method thereof.

2. Description of the Related Art

A vehicle using an internal combustion engine using gasoline or heavy oil as its principle fuel has serious influence on the generation of environmental pollution such as air pollution. In recent years, much effort is made to develop an electric vehicle or a hybrid vehicle so as to reduce the generation of the environmental pollution.

The electric vehicle refers to a vehicle using a battery engine that operates by an electrical energy outputted from a battery. The electric vehicle uses a battery in which a plurality of rechargeable secondary cells is provided as one pack, as the main power source for the electric vehicle. Thus, the electric vehicle has an advantage in that there is no discharge gas and the noise of the electric vehicle is very small.

The hybrid vehicle refers to an intermediary vehicle between the vehicle using the internal combustion engine and the electric vehicle. The hybrid vehicle uses two or more power sources, for example, the internal combustion engine and the battery engine. At present, the hybrid vehicle using the internal combustion engine and a fuel cell for continuously supplying hydrogen and oxygen while inducing a chemical reaction to directly obtain an electrical energy is being developed.

In the vehicle using electrical energy, a performance of the battery has a direct influence on the performance of the vehicle. Thus, each battery cell should not only have an excellent performance, but also a battery management system (BMS) for measuring the voltage of each battery cell and the voltage and the current of the whole battery. Therefore, effectively managing a charge and discharge of each battery cell is seriously required.

The contemporary battery management system uses a method for estimating the state of charge (SOC) by ampere counting. Also, the contemporary battery management system uses a method for previously recognizing a relationship between the SOC and elements such as an open circuit voltage (OCV), a discharge voltage, an internal resistance, a temperature, or a discharge current, detecting at least two elements, and subsequently detecting the SOC associated with the detected elements based on the recognized relationship between the SOC and the detected elements.

In the contemporary SOC estimation method, an error caused by the ampere counting can occur. Even though the relationship between the OCV and the SOC is recognized, it should be calculated at each battery using a complex experimental method since there is a difference in the characteristic of each battery. Accordingly, the contemporary method causes the error or requires the complex experiment method.

The above information disclosed in this Background section is only for enhancement of understanding of the background of the invention and therefore it may contain information that does not exist among the prior art that is already known in this country to a person of ordinary skill in the art.

SUMMARY OF THE INVENTION

It is therefore an object of the present invention to provide an improved electric vehicle system and an improved method for estimating a state of charge of a battery.

It is another object to provide a method for estimating a state of charge of a battery, a battery management system using the same, and a driving method thereof having advantages of reducing calculation using a simple battery model that is able to more accurately estimate SOC using a data rejection.

An exemplary embodiment of the present invention provides a battery management system using a measurement model for modeling a battery, and estimating a SOC (state of charge) of the battery. The system includes a sensor, a predictor, a data rejection unit, and a measurement unit. The sensor senses a charging and discharging current flowing through the battery, a temperature of the battery, and a terminal voltage of the battery. The predictor counts the charging and discharging current, and estimates the SOC of the battery. The data rejection unit generates information associated with an error generated from the measurement model, as a function of at least one of the battery temperature, the charging and discharging current, the SOC, and a dynamic of the charging and discharging current. The measurement unit corrects the estimated SOC of the battery by using the measurement model and the information associated with the error.

The measurement model may include an internal resistor, a diffusion impedance, and an open circuit voltage (OCV). The predictor may set the SOC as a first state variable and set a diffusion impedance voltage applied to the diffusion impedance as a second state variable, and predict the first and second state variables on a per-constant time basis by using the charging and discharging current. The predictor may count the charging and discharging current of an earlier state for a certain time to predict the first and second state variables of a present state.

The data rejection unit may generate the information associated with the error, as a first gain. The measurement unit may predict the battery terminal voltage, using the OCV associated with the SOC estimated in the predictor, a voltage applied to an internal resistor of the measurement model, and the diffusion impedance voltage, and generate a second gain using the first gain and a comparison result of the predicted battery terminal voltage and the measured terminal voltage. The measurement unit may correct the first and second state variables predicted in the predictor, using the second gain, and transmit the corrected first and second state variables to the predictor.

When the SOC is in a first region, the data rejection unit may fix the first gain as a constant value. When the SOC is in a second region, the data rejection unit may control the first gain as a function of the SOC. The first region and the second region may be distinguished as a function of the SOC. The first region may be a region of a SOC of more than 20%. The second region may be a region of a SOC of less than 20%. When the SOC is in the second region, the first gain $R_k$ may be controlled as a function of:

$$R_k = R_{k-1}(1 + G_{SOC}(0.2 - SOC)), \quad (1)$$

where $SOC \leq 0.2$ and $G_{SOC}$ is a proportional constant.

When an absolute value of the charging and discharging current is less than a reference value, the data rejection unit may fix the first gain as a constant value. When the absolute value of the charging and discharging current is more than the reference value, the data rejection unit may control the first gain as a function of the absolute value of the charge and discharge value. The reference value may be equal to 5 amperes (A). When the absolute value of the charging and discharging current is more than the reference value, the first gain $R_k$ is controlled as a function of:

$$R_k = R_{k-1}(1 + G_i(|i| - 5)), \quad (2)$$

where $|i| \geq 5$ and $G_i$ is a constant.

When a dynamic of the charging and discharging current is not sensed, the data rejection unit may fix the first gain as a constant value. When the dynamic of the charging and discharging current is sensed, the data rejection unit may control the first gain in correspondence with a period for generating the dynamic of the charging and discharging current. When the dynamic of the charging and discharging current is sensed, the first gain $R_k$ may be controlled as a function of:

$$R_k = R_{k-1}(1 + G_{step} \cdot T_{steptime}), \quad (3)$$

where $T_{steptime}$ is a period for varying current, and $G_{step}$ is a constant.

The predictor predicts the first state variable $SOC_K$ and the second state variable $V_{Diff\_K}$ as a function of a state equation:

$$\begin{bmatrix} SOC_K \\ V_{Diff\_K} \end{bmatrix} = \begin{bmatrix} 1 & 0 \\ 0 & 1 - \dfrac{\Delta t}{C_{Diff} \cdot R_{Diff}} \end{bmatrix} \cdot \begin{bmatrix} SOC_{K-1} \\ V_{Diff\_K-1} \end{bmatrix} + \begin{bmatrix} \dfrac{\Delta t}{C_n} \\ \dfrac{\Delta t}{C_{Diff}} \end{bmatrix} \cdot i_{K-1}, \quad (4)$$

where $SOC_K$ is the SOC predicted in present state, $SOC_{K-1}$ is the SOC corrected in earlier state, $V_{Diff\_is}$ the voltage applied to diffusion impedance of the present state, $V_{Diff\_K-1}$ is the voltage applied to diffusion impedance corrected in an earlier state, $C_{Diff}$ is the capacitance of diffusion impedance, $R_{Diff}$ is the resistance of diffusion impedance, $\Delta t$ is the temporal interval between the present state and the earlier state, $i_{K-1}$ is the electric current flowing through battery in the earlier state, and $C_n$ is the rating capacitance of battery.

The measurement unit may predict the battery terminal voltage, and may generate a difference between the battery terminal voltage Vt and the predicted battery terminal voltage Vt as a function of an output equation:

$$Vt = OCV - Vdiff - Vr \quad (5)$$

where Vt is the terminal voltage of the battery, $V_{Diff}$ is the diffusion impedance voltage, and Vr is the voltage of an internal resistor.

The measurement unit may generate the second gain $\bar{K}_k$ using Equation:

$$\bar{K}_k = P_k(-) H_k^{[1]T} [H_k^{[1]} P_k(-) H_k^{[1]T} + R_k]^{-1} \quad (6)$$

where $H_k^{[1]}$ is the linearized matrix generated by differentiating an output equation by a state variable, $H_k^{[1]T}$ is the inverse matrix of a linearized matrix, and $P_k(-)$ is the prediction covariance for the estimation error of the state variable.

Another embodiment of the present invention provides a method for estimating a SOC (state of charge) of the battery by using the measurement model for the battery. The method includes measuring a charging and discharging current flowing through the battery, a temperature of the battery, and a terminal voltage of the battery; counting the charging and discharging current, and estimating the SOC of the battery; generating information associated with an error generated from the measurement model, as a function of at least one of the battery temperature, the charging and discharging current, the SOC, and a dynamic of the charging and discharging current; and correcting the estimated SOC of the battery, using the measurement model and the information associated with the error. The measurement model may include an internal resistor, a diffusion impedance, and an open circuit voltage (OCV). The counting and estimating may further include estimating the SOC and a diffusion impedance voltage applied to the diffusion impedance on a per-constant time basis by using the charging and discharging current. The generation of the information may further include generating the information associated with the error, as a first gain. The correction of the SOC may also include predicting the battery terminal voltage, using the OCV associated with the estimated SOC, a voltage applied to an internal resistor of the measurement model, and the diffusion impedance voltage, and generating a second gain using the first gain and a comparison result of the predicted battery terminal voltage and the measured terminal voltage.

The generation of the information may further include fixing the first gain as a constant value when the SOC is in a first region and controlling the first gain as a function of the SOC when the SOC is in a second region, and distinguishing the first region and the second region as a function of the SOC.

The generation of the information may further include fixing the first gain as a constant value when an absolute value of the charging and discharging current is less than a reference value, and controlling the first gain as a function of the absolute value of the charge and discharge value when the absolute value of the charging and discharging current is more than the reference value.

The generation of the information may further include fixing the first gain as a constant value when a dynamic of the charging and discharging current is not sensed, and controlling the first gain in correspondence with to a period for generating the dynamic of the charging and discharging current when the dynamic of the charging and discharging current is sensed.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Figure 1:
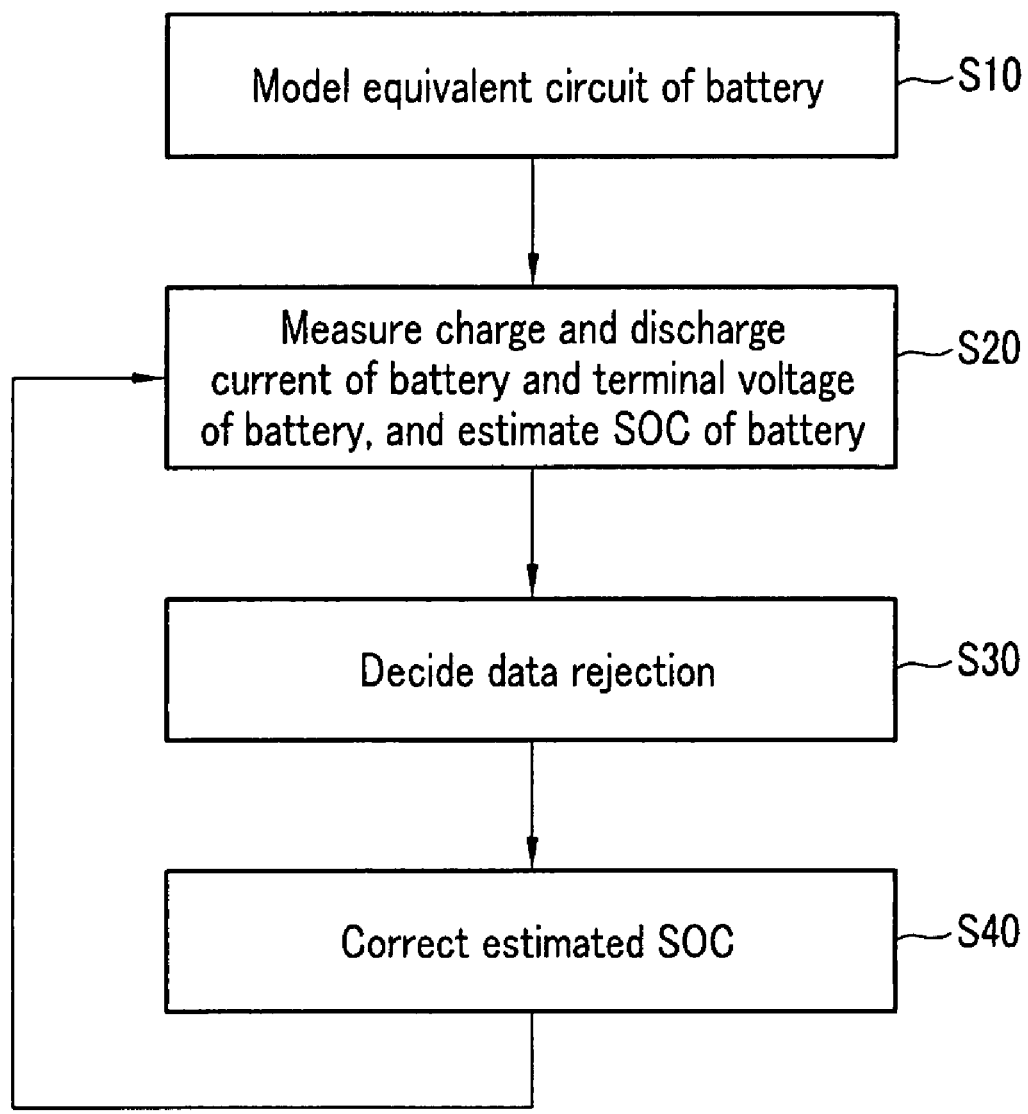
FIG. 1 is a flowchart illustrating a method for estimating a state of charge (SOC) of a battery according to an exemplary embodiment of the principles of the present invention.

The present invention is to provide a method for more accurately estimating a state of charge (SOC) of a battery, a battery management system, and a driving method thereof.

In the following detailed description, only certain exemplary embodiments of the present invention have been shown and described, simply by way of illustration. As those skilled in the art would realize, the described embodiments may be corrected in various different ways, all without departing from the spirit or scope of the present invention. Accordingly, the drawings and description are to be regarded as illustrative in nature and not restrictive. Like reference numerals designate like elements throughout the specification.

In the specification, "connecting" any part with another part not only includes "direct connecting", but also includes "electrically connecting" with a different constituent element interposed between the two parts. Also, "including" a constituent element in a part signifies further including, not excluding, another constituent element if it is no specific reference to the contrary.

An exemplary embodiment of the principles of the present invention will be described with reference to the accompanying drawings below.

FIG. 1 is a flowchart illustrating a method for estimating a state of charge (SOC) of a battery according to an exemplary embodiment of the principles of the present invention.

The method for estimating the SOC of the battery according to an exemplary embodiment of the principles of the present invention uses an adaptive filter and a data rejection method.

As shown in FIG. 1, the battery including at least two packs having a plurality of cells is modeled using an equivalent circuit (Step 10).

A charging and discharging current of the battery, a battery terminal voltage, and a battery temperature are measured, and the SOC of the battery is estimated (Step 20).

The data rejection is decided using the measured charging and discharging current of the battery and the estimated SOC of the battery (Step 30). During the deciding of the data rejection, the equivalent circuit of the battery modeled in Step 10 is set as a measurement model, and a gain corresponding to a variance of an error generated from the measurement model is generated.

The estimated SOC of Step 20 is corrected using the gain generated in Step 30 corresponding to the variance of the error of the measurement model (Step 40). The correction of the estimated SOC is performed using an adaptive filter, particularly, using a Kalman filter. Kalman gain is generated using the gain generated in Step 30 corresponding to the variance of the error of the measurement model, and the SOC estimated in Step 20 is corrected using the generated Kalman gain.

In Step 20, the SOC of the battery is again estimated using the corrected SOC and the charging and discharging current of the battery.

An electric vehicle system using the method for estimating the SOC of the battery will be in detail described below.

Figure 2:
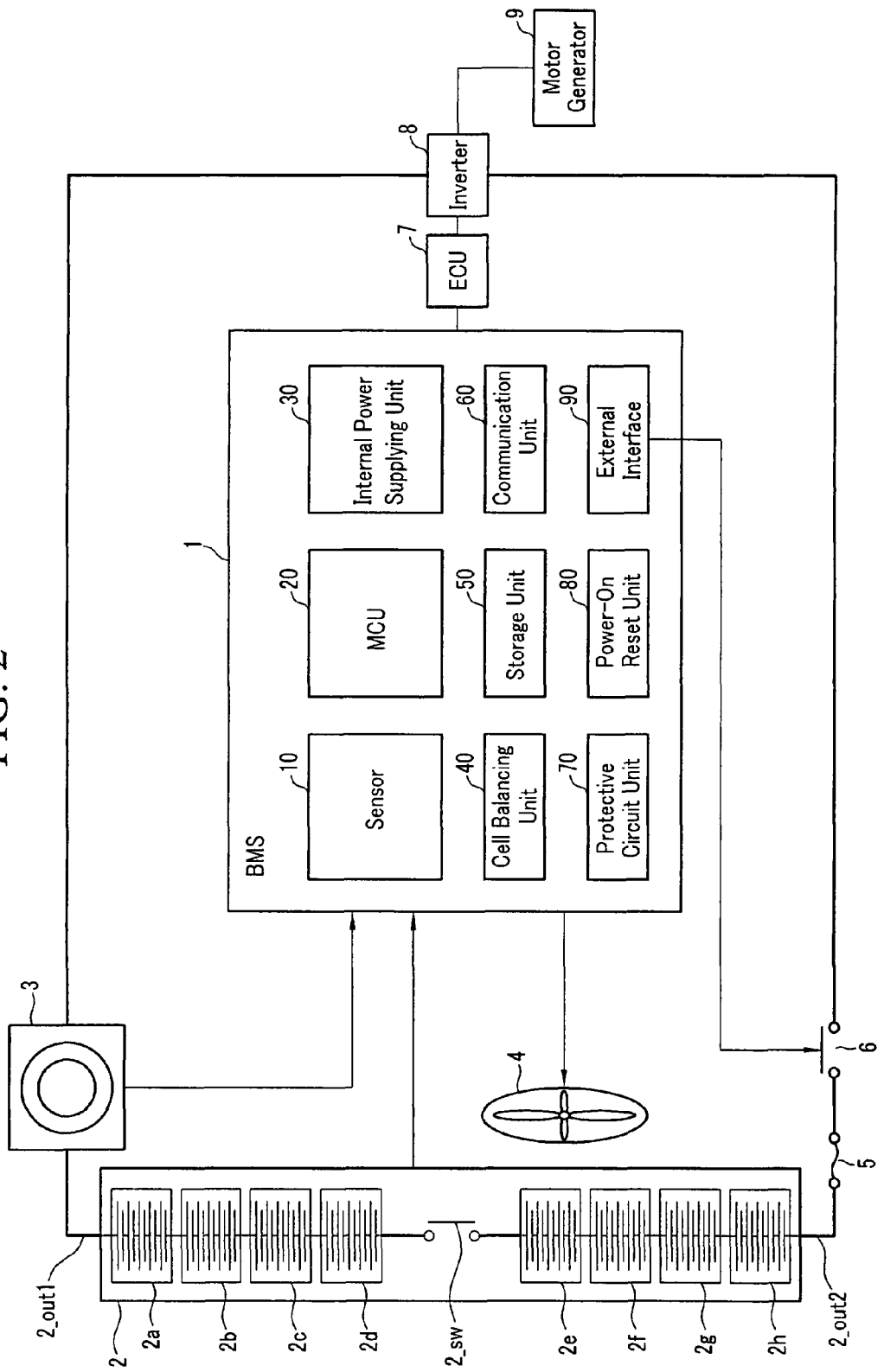
FIG. 2 is a diagram illustrating an electric vehicle system using a method for estimating a SOC of a battery according to an exemplary embodiment of the principles of the present invention.

FIG. 2 is a schematic diagram illustrating the electric vehicle system using the method for estimating the SOC of the battery according to an exemplary embodiment of the principles of the present invention.

As shown in FIG. 2, the vehicle system includes a battery management system (BMS) 1, a battery 2, an electric current sensor 3, a cooling fan 4, a fuse 5, a main switch 6, an engine controller unit (ECU) 7, an inverter 8, and a motor generator 9.

Battery 2 includes a plurality of sub-packs 2a to 2h in which a plurality of battery cells are coupled in series, output terminals 2_OUT1 and 2_OUT2, and a safety switch 2_SW provided between sub-pack 2d and sub-pack 2e. Sub-packs 2a to 2h are exemplarily provided in a number of eight, and each sub-pack is exemplarily illustrated to merely indicate the plurality of battery cells by one group, and is not intended to limit a scope of the present invention. Safety switch 2_SW refers to a switch provided between sub-pack 2d and sub-pack 2e. Safety switch 2_SW can be manually switched on/off for the sake of worker's safety when the battery is replaced or a work is executed for the battery. In an exemplary embodiment of the present invention, safety switch 2_SW is provided between sub-pack 2d and sub-pack 2e, but it is not intended to limit a scope of the present invention. Both output terminal 2_OUT1 and output terminal 2_OUT2 connect to inverter 8.

Electric current sensor 3 measures an amount of electric current outputted from battery 2, and outputs the measured current amount to a sensor 10 of BMS 1. Electric current sensor 3 can be a Hall current transformer (CT) for measuring the current by using a Hall device, and outputting an analog current signal associated with the measured current.

Cooling fan 4 dissipates a heat generated during the charge and discharge of battery 2 on the basis of a control signal of BMS 1, thereby preventing battery 2 from being degenerated due to an increase of temperature, and preventing an efficiency of the charge and discharge from being reduced.

Fuse 5 either disconnects or short-circuits battery 2, thereby preventing an overcurrent from being transmitted to battery 2. In other words, when the overcurrent is generated, fuse 5 disconnects battery 2, thereby preventing the overcurrent from being transmitted to battery 2.

When abnormal overvoltage, overcurrent, or high temperature occur, main switch 6 switches off battery 2 on the basis of the control signal of BMS 1 or ECU 7 of the vehicle.

BMS 1 includes sensor 10, a main control unit (MCU) 20, an internal power supplying unit 30, a cell balancing unit 40, a storage unit 50, a communication unit 60, a protective circuit 70, a power-on reset unit 80, and an external interface 90.

Sensor 10 senses and transmits the battery charging and discharging current, the battery terminal voltage, the voltage across each cell, a cell temperature, and a peripheral temperature, to MCU 20.

MCU 20 generates information for estimating the SOC and a state of health (SOH) of battery 2 on the basis of the battery charging and discharging current, the battery terminal voltage, each cell voltage, the cell temperature, and the peripheral temperature received from sensor 10, and for informing a state of battery 2, and transmits the generated information to ECU 7 of the vehicle. ECU 7 of the vehicle charges and discharge battery 2 on the basis of the SOC and the SOH received from MCU 20. In an exemplary embodiment of the present invention, MCU 20 uses a method for modeling the battery by the equivalent circuit, predicting the SOC to be estimated, and correcting the predicted SOC. The equivalent circuit modeling the battery is set as the measurement model, and uses the data rejection method to correct the predicted SOC in consideration of the variance of the error generated from the measurement model. A detailed description will be made with reference to FIGS. 3 to 5 below.

Internal power supplying unit 30 supplies a power source to BMS 1 using a sub battery. Cell balancing unit 40 balances the state of charge of each cell. In other words, cell balancing unit 40 can discharge a cell of a relatively high charged state, and can charge a cell of a relatively low charged state. Storage unit 50 stores data of the SOC and SOH when BMS 1 is powered off. Storage unit 50 can be a nonvolatile storage unit that is an electrically erasable programmable read only memory (EEPROM). Communication unit 60 communicates with ECU 7 of the vehicle. Protective circuit 70 protects battery 2 from external impact, overcurrent, and low voltage, using a firmware. Power-on reset unit 80 resets an entire system when BMS 1 is powered on. External interface 90 connects sub devices of BMS 1, such as cooling fan 4 and main switch 6, to MCU 20. In the exemplary embodiment of the present invention illustrated in FIG. 2, only cooling fan 4 and main switch 6 are shown but are not intended to limit a scope of the present invention.

ECU 7 determines a degree of a torque of the vehicle on the basis of the information of a component of the vehicle, such as an accelerator, a brake, and a speed of the vehicle, and controls motor generator 9 to have an output based on torque information. In other words, ECU 7 controls the switching of inverter 8, and controls motor generator 9 to have the output based on the torque information. ECU 7 receives the SOC of battery 2 from MCU 20 through communication unit 60 of BMS 1, and controls the SOC of battery 2 to reach a target value (e.g., 55%). For example, if ECU 7 receives the SOC of 55% or less from MCU 20, ECU 7 controls a switch of inverter 8 to output a power toward battery 2, thereby charging battery 2; if ECU 7 receives the SOC of 55% or more, ECU 7 controls the switch of inverter 8 to output the power toward motor generator 9, thereby discharging battery 2.

Inverter 8 enables battery 2 to be charged or discharged on the basis of the control signal of ECU 7.

Motor generator 9 drives the vehicle on the basis of the torque information received from the ECU 7, using the electrical energy of battery 2.

As a result, ECU 7 charges and discharges battery 2 as much as a rechargeable power on the basis of the SOC, thereby preventing battery 2 from being overcharged and overdischarged and making it possible to efficiently use battery 2 for a long time. When battery 2 is installed in the vehicle, however, it is difficult to measure an actual SOC of battery 2. Therefore, BMS 1 should accurately estimate the SOC, using the pack current and the pack voltage sensed in sensor 10, and transmit the estimated SOC to ECU 7.

BMS 1 according to an exemplary embodiment of the present invention will be described with reference to FIGS. 3 to 5 below.

Figure 3:
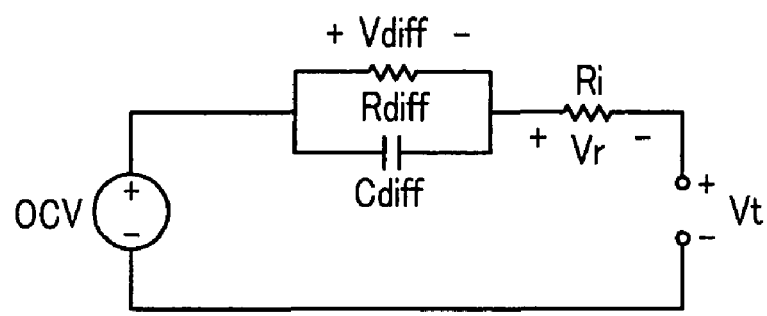
FIG. 3 is an equivalent circuit of a battery according to an exemplary embodiment of the principles of the present invention.

FIG. 3 is the equivalent circuit of the battery according to an exemplary embodiment of the present invention.

As shown in FIG. 3, the equivalent circuit of the battery includes a diffusion impedance, an internal resistance $R_i$, and the OCV. According to an exemplary embodiment of the present invention, the diffusion impedance can be expressed using a resistor $R_{diff}$ and a capacitor $C_{diff}$, and the OCV can be expressed using a function of the SOC. According to an exemplary embodiment of the present invention, resistor $R_{diff}$ and capacitor $C_{diff}$ are set unchanged as a function of an external element like the SOC, the temperature, and the charging and discharging current i flowing through the battery. Internal resistance $R_i$ varies as a function of the battery temperature like the cell temperature or the ambient temperature of the cell. A relationship between the internal resistance and the temperature is established by an experiment method. Error caused by the variation of resistor $R_{diff}$ and capacitor $C_{Diff}$ can be corrected using the data rejection method based on the error variance. The data rejection method will be described later in detail. The equivalent circuit of the battery according to an exemplary embodiment of the present invention will be briefly described by the measurement model below.

MCU 20 according to an exemplary embodiment of the present invention will be in detail described with reference to FIG. 4 below.

Figure 4:
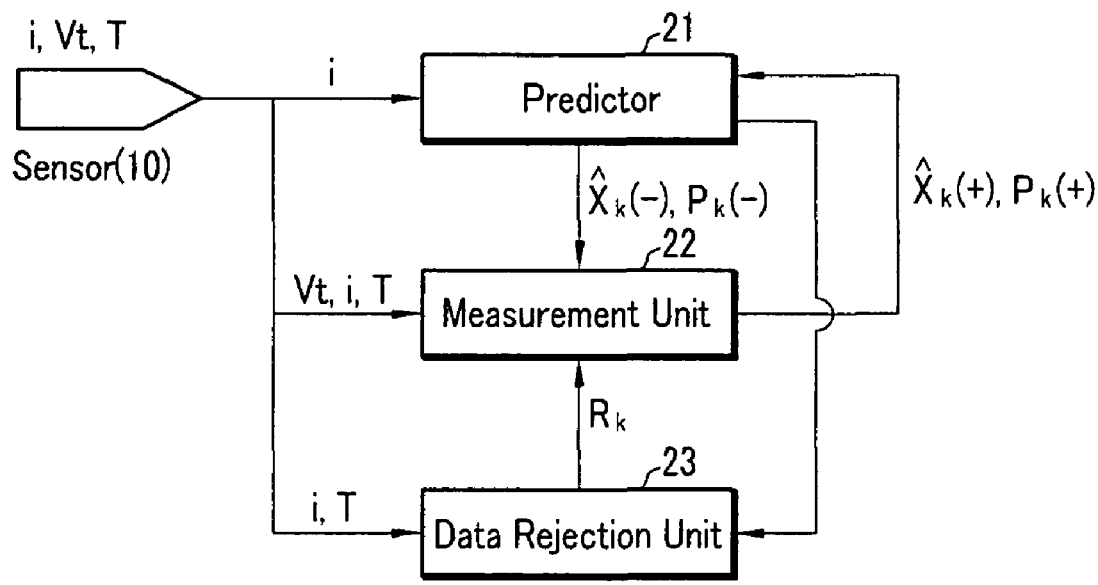
FIG. 4 is a diagram illustrating a main control unit (MCU) according to an exemplary embodiment of the principles of the present invention.

FIG. 4 is a diagram illustrating MCU 20 according to an exemplary embodiment of the present invention. MCU 20 includes a predictor 21, a measurement unit 22, and a data rejection unit 23.

Predictor 21 predicts a parameter for indicating the state of the battery using the ampere counting method. In the measurement model described with reference to FIG. 2, the SOC and capacitance $C_{diff}$ of the diffusion impedance $Z_{diff}$ are provided as the parameter for indicating the state. Predictor 21 receives the charging and discharging current i flowing through the battery from sensor 10, performs the measurement using the ampere counting method, and predicts the SOC that is a present state of the battery. Predictor 21 predicts a voltage Vdiff applied between both terminals of the diffusion impedance $Z_{diff}$ by using the charging and discharging current i flowing through the battery.

In the measurement model, measurement unit 22 corrects the predicted parameters to indicate the battery state by using a measurable parameter associated with a state to be estimated. Measurement unit 22 receives battery terminal voltage $V_t$ measured by sensor 10 in the measurement model, calculates the SOC predicted in predictor 21 and the OCV associated with temperature T that is received from sensor 10, calculates a voltage $V_r$ applied across internal resistance $R_i$ by using the internal resistance and the charging and discharging current i received form sensor 10, estimates the battery terminal voltage $V_t$ by using the calculated OCV and voltage $V_r$ and diffusion impedance voltage $V_{diff}$ predicted in predictor 21, compares the estimated battery terminal voltage $V_t$ with the measured battery terminal voltage $V_t$, and corrects the predicted SOC and the like on the basis of the comparison result.

Data rejection unit 23 controls measurement unit 22 to correct the predicted parameters of the battery considering the variance of the error generated from the measurement model. MCU 20 stores information of the variance of the error generated from the measurement model as a function of the SOC of the battery, the charging and discharging current flowing through the battery, the temperature, and a dynamic of the current. MCU 20 can further include a database (not shown) for constructing and storing the information by a data table. The information can be generated in the experiment method. Data rejection unit 23 detects the variance of the measurement error as a function of the present state from the data table by using the data table, and transmits the detected error variance to measurement unit 22. Measurement unit 22 decides a degree of correction of the predicted parameter of the battery as a function of the detected error variance.

The battery management system in which a prediction is performed, a prediction error is corrected using the adaptive filter, the SOC of the battery is estimated, and the error generated between an actual battery and the measurement model of the battery is prevented using the data rejection method, will be described below.

Predictor 21 and estimator (i.e., measurement unit) 22 of MCU 20 employ algorithm that is similar with an extended Kalman filter (EKF), a kind of the adaptive filter. The EKF is extended and applied to a nonlinear system for partially linearizing a general Kalman filter. Predictor 21 predicts state variables x, which are the SOC of the battery and voltage $V_{Diff}$ applied across the diffusion impedance, using a state equation (a) in Equation 1. Predictor 21 uses a nonlinear matrix equation (b) as a state equation (a) in Equation 1. In equation (b), the ampere counting is performed for a certain time, and the SOC and voltage $V_{Diff}$ are discretely predicted.

Equation 1

$$x_k(-) = f_{k-1}(x_{k-1}, u_{k-1}) + w_{k-1} \qquad (a)$$

$$\begin{bmatrix} SOC_K \\ V_{Diff\_K} \end{bmatrix} = \begin{bmatrix} 1 & 0 \\ 0 & 1 - \dfrac{\Delta t}{C_{Diff} \cdot R_{Diff}} \end{bmatrix} \cdot \begin{bmatrix} SOC_{K-1} \\ V_{Diff\_K-1} \end{bmatrix} + \begin{bmatrix} \dfrac{\Delta t}{C_n} \\ \dfrac{\Delta t}{C_{Diff}} \end{bmatrix} \cdot i_{K-1} \qquad (b)$$

In Equation 1 (b), $SOC_K$ and $V_{Diff\_K}$ correspond to state variable $x_k(-)$. $SOC_K$ denotes a SOC predicted in the present state, and $SOC_{K-1}$ denotes a value obtained by correcting a SOC predicted in an earlier state and correcting an error in measurement unit 22. $V_{Diff\_K}$ denotes voltage $V_{Diff}$ applied to the diffusion impedance of the present state, and $V_{Diff\_K-1}$ denotes a value obtained by correcting voltage $V_{Diff}$ applied to the diffusion impedance predicted in the earlier state, and correcting the error in measurement unit 22. $C_{Diff}$ and $R_{Diff}$ denote the capacitance and the resistance of the diffusion impedance, respectively. Predictor 21 estimates the SOC by a discrete time, and $\Delta t$ is a temporal interval between the present state and earlier state. $i_{K-1}$ denotes the electric current flowing through the battery in the earlier state. $C_n$ denotes a constant value corresponding to a rating capacitance of the battery, and does not vary as a function of the state.

$$\begin{bmatrix} 1 & 0 \\ 0 & 1 - \dfrac{\Delta t}{C_{Diff} \cdot R_{Diff}} \end{bmatrix}$$

corresponds to $f_{k-1}$ in $$\begin{bmatrix} \dfrac{\Delta t}{C_n} \\ \dfrac{\Delta t}{C_{Diff}} \end{bmatrix} \cdot i_{K-1}. \qquad \text{Equation 1(a)}$$

corresponds to $w_{k-1}$ in Equation 1(a), and is inputted in each state.

Predictor 21 predicts a covariance $P_k(-)$ for the estimation error of state variable x on a per-discrete time basis, using Equation 2, and transmits predicted covariance $P_k(-)$ to measurement unit 22.

$$P_k(-) = A_{k-1}^{[1]} P_{k-1}(+) A_{k-1}^{[1]T} + Q_{k-1}, \qquad \text{Equation (2)}$$

$$A_{k-1}^{[1]} \approx \left. \frac{\partial f_{k-1}}{\partial x} \right|_{x = \hat{x}_{k-1}(-)}$$

$A_{k-1}^{[1]}$ denotes a value obtained by differentiating and linearizing nonlinear matrix equation $f_{k-1}$ by the state variable, and $Q_k$ denotes a variance value of the state variable based on each state.

Predictor 21 generates and transmits the predicted state variable $\hat{x}_k(-)$, and covariance $P_k(-)$ for the estimation of the error of the state variable, to measurement unit 22.

Measurement unit 22 corrects the predicted SOC and voltage $V_{Diff}$ using the measurement model. Measurement unit 22 predicts a value that can be measured using the SOC and voltage $V_{Diff}$ predicted in predictor 21, that is, battery terminal voltage $V_t$, using an output equation like Equation 3.

$$Vt = OCV - Vdiff - Vr \qquad \text{Equation 3}$$

Vr denotes a voltage drop occurring when current i flows through internal resistor Ri. Measurement unit 22 uses a differential equation like Equation 4, for generating a Kalman gain to solve a nonlinearity between the SOC and the OCV and use the Kalman filter.

$$\frac{\partial h_K}{\partial x_K} = \begin{bmatrix} \dfrac{\partial h_{SOC}(SOC)}{\partial SOC} & 0 \\ 0 & -1 \end{bmatrix}, \text{ where} \qquad \text{Equation 4}$$

$$OCV = h_{SOC}(SOC), h_{SOC} = f_{OCV}^{-1}$$

Equation 4 can define the OCV as the function of the SOC, and equation 4 is of a type in which the output equation is differentiated by the state variable (SOC).

Measurement unit 22 generates Kalman gain $\overline{K}_k$ to correct the predicted SOC and voltage Vdiff. Equation 5 is to calculate the Kalman gain.

$$\overline{K}_k = P_k(-) H_k^{[1]T} [H_k^{[1]} P_k(-) H_k^{[1]T} + R_k]^{-1}, \qquad \text{Equation 5}$$

$$H_k^{[1]} \approx \left. \frac{\partial h_k}{\partial x} \right|_{x = \hat{x}_{k-1}(-)}$$

$\overline{K}_k$ denotes the Kalman gain. The Kalman gain is decided to have a value for minimizing covariance. $H_k^{[1]}$ denotes Equation 4 showing a differential matrix to linearize a function of predicted state variable x and output variable y, with the output variable y being $V_t$ in Equation 3. $H_k^{[1]T}$ denotes an inverse matrix of $H_k^{[1]}$, and $R_k$ denotes the variance of the error generated from the measurement model. As described above, $R_k$ can be set as a function of the SOC, an intensity of the electric current, the temperature, and the dynamic of the electric current. Measurement unit 22 can detect and use $R_k$ corresponding to at least two elements among the SOC, the intensity of the electric current, the temperature, and the dynamic of the electric current. Measurement unit 22 corrects the predicted state variable x, using the generated Kalman gain, as in Equation 6.

$$\hat{x}_k(+) = \hat{x}_k(-) + \overline{K}_k(z_k - \hat{z}_k) \qquad \text{Equation 6}$$

Variable x corresponds to the SOC and voltage $V_{Diff}$, and variable z corresponds to battery terminal voltage $V_t$. $\hat{x}_k(+)$ denotes variable x obtained by error correcting the predicted SOC by using the Kalman gain, and $\hat{x}_k(-)$ denotes variable x predicted in predictor 21. $z_k$ denotes an average of battery terminal voltage $V_t$, and $\hat{z}_k$ denotes battery terminal voltage $V_t$ currently measured in the measurement model. Measurement unit 22 generates covariance $P_k(+)$ for the estimation of the error of corrected state variable $\hat{x}_k(+)$, using the Kalman gain, as in Equation 7.

$$P_k(+) = \{I - \overline{K}_k H_k^{[1]}\} P_k(-) \qquad \text{Equation 7}$$

$P_k(+)$ denotes the covariance for the estimation error of each of the corrected SOC and the corrected voltage $V_{Diff}$ that are state variable $\hat{x}_k(+)$. I denotes an identity matrix.

Measurement unit 22 corrects predicted SOC (i.e., $\hat{x}_k(-)$) and covariance $P_k(-)$ using the Kalman gain, and generates SOC (i.e., $\hat{x}_k(+)$) and covariance $P_k(+)$. SOC (i.e., $\hat{x}_k(+)$) and covariance $P_k(+)$ are transmitted to predictor 21, and are set as initial values for predicting a next state.

In such a method, measurement unit 22 generates and transmits corrected voltage $V_{Diff}$ and covariance even for predicted voltage $V_{Diff}$ to predictor 21. Then, they are set as initial values for predicting the next state.

Data rejection unit 23 detects variance $R_k$ of the error of the measurement model corresponding to the present state, from the data table, corrects the error variance $R_k$ as a function of the present state, and transmits the corrected variance $R_k$ to measurement unit 22. In an exemplary embodiment of the present invention, data rejection unit 23 uses the variance of the error caused by an inaccuracy of the measurement model in deciding how much it corrects the predicted state using the measurement model. In Equation 5, the Kalman gain varies as a function of error variance $R_k$, and error variance $R_k$ is decided as a function of the error of the measurement model. Accordingly, the Kalman gain is decided as a function of the error generated from the measurement model, and the prediction SOC is corrected as in Equation 6.

For example, when error variance $R_k$ is an infinite value, the Kalman gain is equal to zero as appreciated in Equation 5. Then, SOC (i.e., $\hat{x}_k(+)$) corrected and generated by the measurement model in measurement unit 22 becomes identical with prediction SOC($\hat{x}_k(-)$).

A method for deciding error variance $R_k$ in data rejection unit 23 as a function of the error of the measurement model will be described below.

In an exemplary embodiment of the present invention, data rejection unit 23 sets a reliable section and an unreliable section for temperature T, SOC, the dynamic of the electric current, and the intensity of the electric current, and controls error variance $R_k$ as a function of the section. Temperature T can be received from the sensor, and the SOC can use the information received from predictor 21. They are not intended, however, to limit a scope of the present invention. Variance $R_k$ is fixed as a preset constant value in the reliable section, and is changed by data rejection unit 23 in the unreliable section.

In other words, the battery cell temperature or the cell peripheral temperature is detected. When the detected temperature is in the reliable section, error variance $R_k$ is fixed as the preset value, and the Kalman gain is generated. On the contrary, when the detected temperature is in the unreliable section, error variance $R_k$ is changed using a relationship between the temperature and error variance $R_k$ through the experiment, and the Kalman gain is generated.

A method for controlling error variance $R_k$ as a function of the SOC will be described in detail. The battery has a complex measurement model due to diffusion at both terminals of the SOC and other complicated elements. Therefore, the measurement model can be also differently constructed on a per-SOC region basis. This, however, makes a process of estimating the SOC complex. Therefore, as described above, MCU 20 uses the measurement model having the equivalent circuit of FIG. 2, and uses the error generated from the measurement model, thereby determining a degree of data rejection and estimating the SOC.

Figure 6:
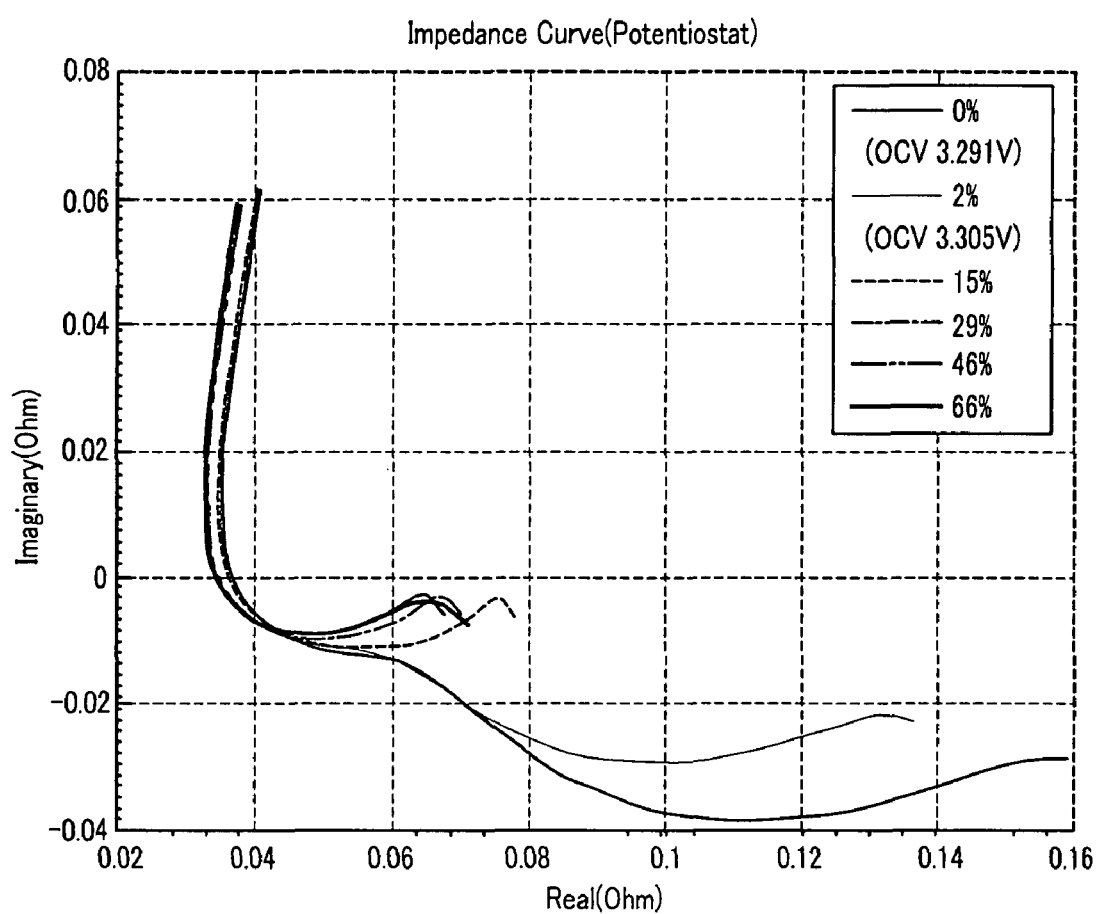
FIG. 6 is a graph illustrating an impedance of the measurement model on a per-SOC region basis.

FIG. 6 shows a graph illustrating an impedance of the measurement model on a per-SOC region basis.

As shown in FIG. 6, in a low SOC region (SOC of less than 20%), the impedance follows an impedance curve different from those of other SOC regions, although the difference depends on the OCV.

Data rejection unit 23 classifies the SOC region of less than 20%, as the unreliable section. In the reliable section of the SOC of 20% or more, data rejection unit 23 transmits variance $R_k$ of the measurement error generated from the measurement model, as the preset value, to measurement unit 22. On contrary, in the unreliable section of the SOC of 20% or less, the variance $R_k$ of the measurement error generated from the measurement model is changed and transmitted to measurement unit 22. Measurement unit 22 generates the Kalman gain using the error variance $R_k$. When the error variance $R_k$ is controlled as a function of the SOC region, it is expressed as in Equation 8.

$$R_k = R_{k-1}(1 + G_{SOC}(0.2 - SOC)), \text{ where } SOC \leq 0.2 \qquad \text{Equation 8}$$

In Equation 8, $R_k$ denotes the error variance controlled as a function of the present state, and $R_{k-1}$ denotes the error variance in the earlier state. $G_{SOC}$ denotes a variable for deciding a data rejection effect, and is measured through the experiment. According to an exemplary embodiment of the present invention, $G_{SOC}$ is equal to "10".

As described above, in the unreliable section, error variance $R_k$ increases more than the preset value, and the Kalman gain decreases. Then, the SOC predicted in predictor 21 reduces in its correction range where it is corrected using the measurement model by measurement unit 22.

Figure 7:
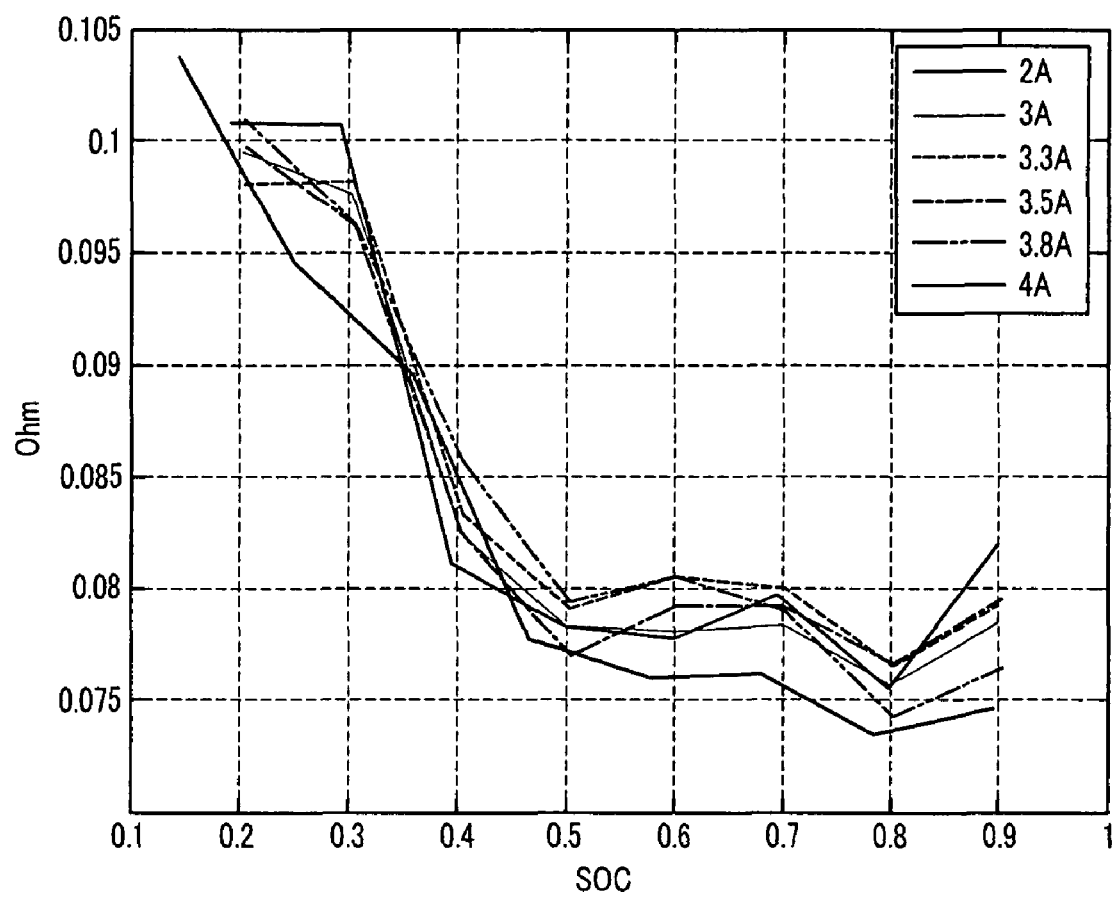
FIG. 7 is a graph illustrating a relationship between the SOC and a total resistance of the battery as a function of the intensity of the discharge current of the battery.

The accuracy of estimating the SOC of the battery can be varied as a function of the current flowing through the battery, that is, the intensity of the charging and discharging current. This happens due to not only a nonlinear characteristic of the battery but also the error generated from the measurement model. FIG. 7 shows a graph illustrating a relationship between the SOC and a total resistance of the battery as a function of the intensity of the discharge current of the battery.

As in FIG. 7, as the charge current increases, a total battery resistance to the SOC decreases. According to such characteristic, in case where a resistance is fixed as a single constant in the measurement model, when the charging and discharging current is large, the measurement model gets inaccurate. In consideration of this, in the reliable section that is a region where the charging and discharging current is less than 5 amperes (A) in its absolute value, a previously set $R_k$ is used. In the unreliable section that is a region where the charging and discharging current is 5 A or more, $R_k$ is changed as in Equation 9 and the calculated $R_k$ is used to generate the Kalman gain.

$$R_k = R_{k-1}[1 + G_I(|i| - 5)], \text{ where } |i| \geq 5 \qquad \text{Equation 9}$$

$R_k$ denotes the error variance controlled as a function of the present state, and $R_{k-1}$ denotes the error variance in the earlier state. $G_i$ denotes a constant value obtained through experiment, and $G_i$ is equal to "2" in an exemplary embodiment of the present invention.

As above, in the unreliable section where the current intensity is out of a range of a certain reference value, $R_k$ increases, and thus the Kalman gain decreases. Then, the SOC predicted in predictor 21 reduces in its correction range where it is corrected using the measurement model by measurement unit 22.

Figure 8:
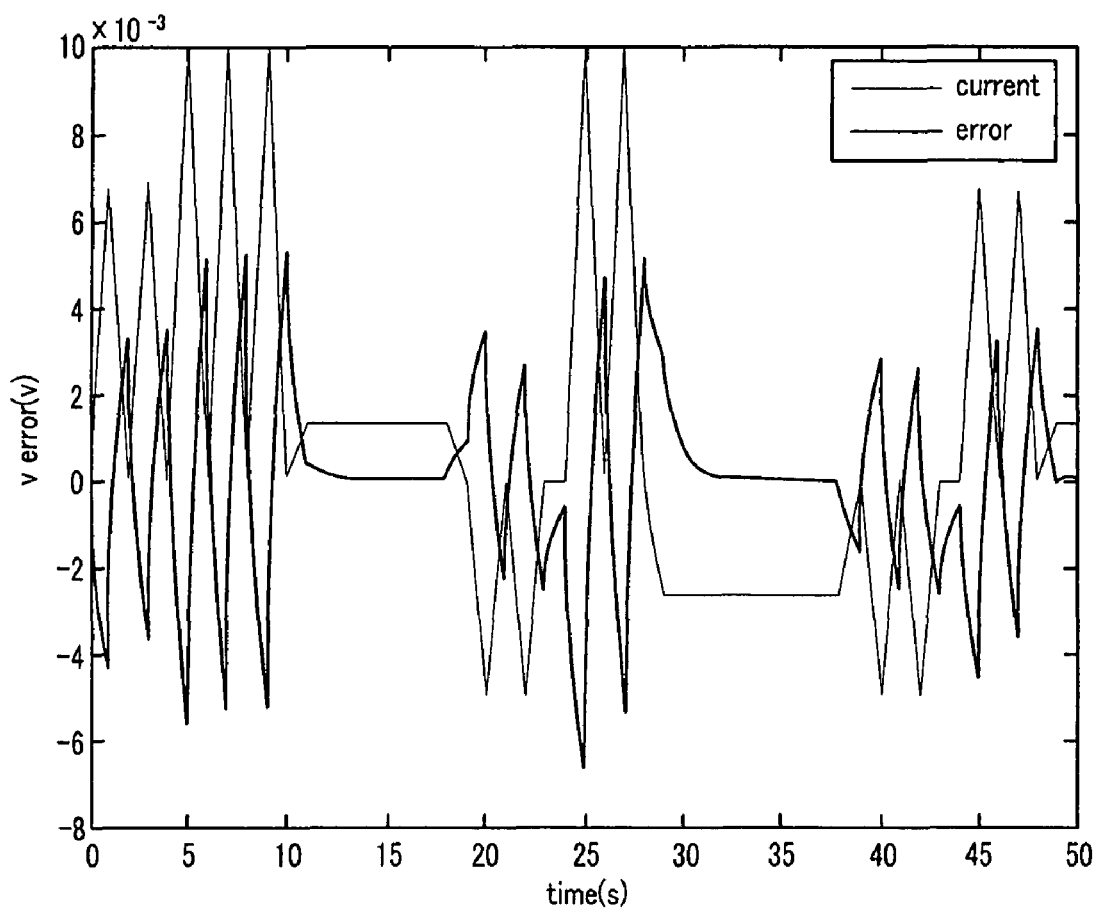
FIG. 8 is a graph illustrating a degree of the error generated as a function of the dynamic of the current.

The accuracy of estimating the SOC of the battery can be varied as a function of the dynamic of the charging and discharging current. The dynamic of the electric current refers to an amount of variation of the electric current dependent on time. In other words, the dynamic of the current is large when the variation of the current per unitary time is large, and the dynamic of the current is small when the variation of the current per unitary time is small. In the measurement model, a capacitor component is simplified and modeled, and the error occurs when the dynamic of the current is generated. FIG. 8 shows a graph illustrating a degree of the error generated as a function of the dynamic of the current.

As shown in FIG. 8, as a dynamic of the charging and discharging current is small, the error is small. Data rejection unit 23 determines a reliable charging and discharging current section when the dynamic of the charging and discharging current is not generated, and the charging and discharging current is kept as a constant value in the reliable charging and discharging current section. On the contrary, data rejection unit 23 determines an unreliable charging and discharging current section when the current dynamic in which the charging and discharging current varies as a function of time is generated. In the unreliable charging and discharging current section, data rejection unit 23 changes error variance $R_k$ as in Equation 10.

$$R_k = R_{k-1}(1 + G_{step} \cdot T_{steptime}) \quad \text{Equation 10}$$

$R_k$ denotes a variance of an error controlled as a function of a present state, and $R_{k-1}$ denotes a variance of an error in an earlier state. $T_{steptime}$ denotes a period for varying the current, and $G_{step}$ denotes a constant obtained through experiment.

As above, when the period for varying the current is lengthened, error variance $R_k$ increases, and the Kalman gain decreases. Then, the SOC predicted in predictor 21 reduces in its correction range where it is corrected using the measurement model by measurement unit 22.

A driving method of the BMS using the method for estimating the SOC of the battery according to an exemplary embodiment of the principles of the present invention will be described with reference to FIG. 5.

Figure 5:
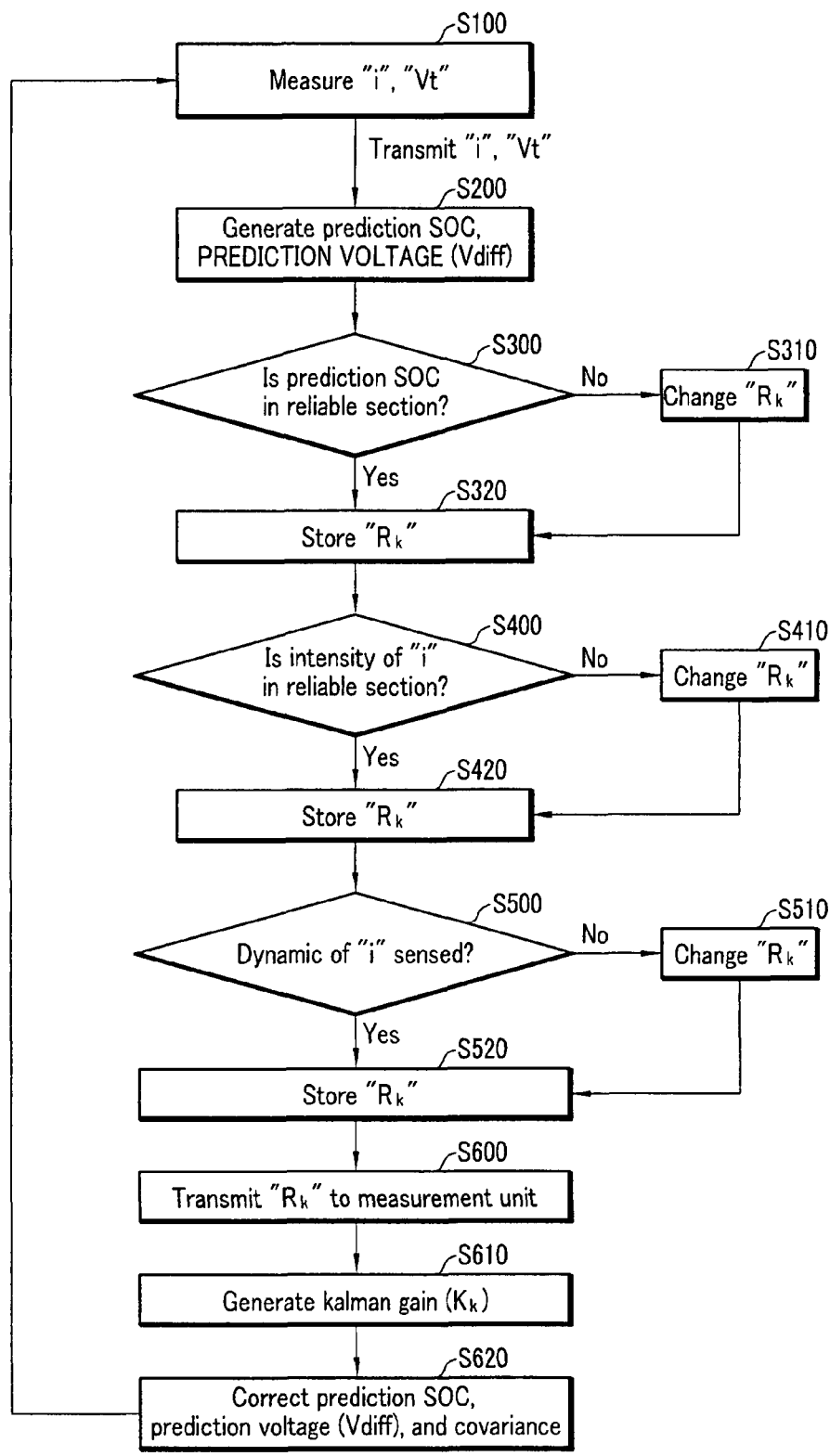
FIG. 5 is a flowchart illustrating a driving method of a battery management system (BMS) according to an exemplary embodiment of the principles of the present invention.

FIG. 5 is a flowchart illustrating the driving method of the BMS according to an exemplary embodiment of the present invention.

Sensor 10 measures the charging and discharging current i and battery terminal voltage Vt, and transmits the measured charging and discharging current i and battery terminal voltage Vt to MCU 20 (Step 100).

Predictor 21 generates the prediction SOC and prediction voltage $V_{diff}$ using the charging and discharging current received from sensor 10 (Step 200).

Data rejection unit 23 receives the prediction SOC from predictor 21, and determines whether or not the prediction SOC is in the reliable section (Step 300). When the prediction SOC is out of the reliable section, data rejection unit 23 changes error variance $R_k$ using Equation 8 (Step 310).

Data rejection unit 23 temporarily stores error variance $R_k$ when it is determined that the SOC is in the reliable section in Step 300, and temporarily stores changed variance $R_k$ when error variance $R_k$ is changed (Step 320).

Next, data rejection unit 23 determines whether or not the intensity of the charging and discharging current is in the reliable section (Step 400). When it is determined that the intensity of the charging and discharging current is out of the reliable section, data rejection unit 23 changes error variance $R_k$ using Equation 9 (Step 410). Data rejection unit 23 temporarily stores error variance $R_k$ (S410).

Data rejection unit 23 temporarily stores error variance $R_k$ when it is determined that the intensity of the charging and discharging current is in the reliable section in Step 400, and temporarily stores changed variance $R_k$ when error variance $R_k$ is changed (Step 420).

Data rejection unit 23 determines whether or not the dynamic of the charging and discharging current is sensed (Step 500). When it is determined that the dynamic of the charging and discharging current is sensed in Step 500, data rejection unit 23 changes error variance $R_k$ using Equation 10 (Step 510).

Data rejection unit 23 temporarily stores error variance $R_k$ when it is determined that the dynamic of the charging and discharging current is not sensed in Step 500, and temporarily stores changed variance $R_k$ when error variance $R_k$ is changed (Step 520).

Data rejection unit 23 transmits stored error variance $R_k$ to measurement unit 22 (Step 600).

Measurement unit 22 generates the Kalman gain using the received error variance $R_k$ (Step 610). Measurement unit 22 corrects the prediction SOC, prediction voltage $V_{diff}$, and the covariance as a function of the generated Kalman gain, and transmits the prediction SOC, prediction voltage $V_{diff}$, and the covariance to be transmitted predictor 21 (Step 620).

Predictor 21 receives and uses the corrected SOC and voltage $V_{Diff}$ to predict a next state. Predictor 21 generates the prediction SOC and voltage $V_{diff}$ of the present state, using the charging and discharging current and the battery terminal voltage received from the sensor in the present state and the SOC and the voltage $V_{diff}$ corrected in the earlier state. The above process is repeated.

As described above, in the driving method of the BMS according to an exemplary embodiment of the present invention, the state of the battery is estimated considering the error of the measurement model using the data rejection method. Accordingly, the battery state, that is, the SOC more accurate than in a contemporary art can be estimated. In case where the battery is modeled using a complex model, and its SOC is estimated, there is a disadvantage in which it needs a complex calculation. In an exemplary embodiment of the present invention, however, since a simple battery model is used, calculation can be reduced, and the accuracy of the SOC estimated using the data rejection method can be improved.

It is described that in the driving method of the BMS according to an exemplary embodiment of the present invention, error variance $R_k$ is set correspondingly to the SOC, the dynamic of the current, and the intensity of the current. But, variance $R_k$ of the error caused by the temperature can be set. Error variance $R_k$ can be set considering at least one of the temperature, the current dynamic, and the current intensity.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

In one aspect, the present invention provides the method for estimating the SOC of the battery using the data rejection method and adaptive filter methods.

In another aspect, the present invention provides the battery management system and the driving method thereof, for estimating the state of the battery using the data rejection method and adaptive filter methods.

The present invention provides the method for estimating the SOC, the battery rejection system, and the driving method thereof, for reducing the calculation using the simple battery model, and estimating more accurate SOC using the data rejection method.

The present invention provides the battery management system and the driving method thereof, for estimating the more accurate SOC considering the variance of the error of the measurement model.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A battery management system, comprising:
   a sensor providing indications of charging and discharging current flowing through a battery, temperature of the battery, terminal voltage of the battery;
   a predictor counting the charging and discharging current, and using a measurement model of the battery to estimate a state-of-charge of the battery;
   a data rejection unit for generating information associated with errors attributable to a measurement model of the battery, as a function of at least one of the battery temperature, the charging and discharging current, the state-of-charge, and a dynamic of the charging and discharging current; and
   a measurement unit making a correction of the state-of-charge in dependence upon the measurement model and the information associated with the errors.

2. The system of claim 1, with the measurement model comprising an internal resistor, a diffusion impedance, and an open circuit voltage (OCV), and
   with the predictor setting the state-of-charge as a first state variable and setting a diffusion impedance voltage applied to the diffusion impedance as a second state variable, and predicting the first and second state variables on a per-constant time basis by using the charging and discharging current.

3. The system of claim 2, with the predictor counting the charging and discharging current of an earlier state for a certain time to predict the first and second state variables of a present state.

4. The system of claim 2, with the data rejection unit generating the information associated with the error, as a first gain, and
   with the measurement unit predicting the battery terminal voltage by using the open circuit voltage associated with the state-of-charge estimated in the predictor, a voltage applied to an internal resistor of the measurement model, and the diffusion impedance voltage, and generating a second gain using the first gain and a comparison between the predicted battery terminal voltage and the measured terminal voltage.

5. The system of claim 4, with the measurement unit correcting the first and second state variables predicted in the predictor by using the second gain, and transmitting corrected first and second state variables to the predictor.

6. The system of claim 4, with, when the state-of-charge is in a first region, the data rejection unit fixing the first gain as a constant value, and, when the state-of-charge is in a second region, the data rejection unit controlling the first gain as a function of the state of charge, and with the first region and the second region being distinguished as a function of the state of charge.

7. The system of claim 6, with the first region being a region of a state-of-charge of more than 20%, and the second region being a region of a state-of-charge of less than 20%, and
   with, when the state-of-charge is in the second region, the first gain $R_k$ being controlled as a function of $R_k\, R_{k-1}(1+G_{SOC}(0.2-SOC))$, where $SOC \leqq 0.2$ and $G_{SOC}$ is a proportional constant.

8. The system of claim 4, with, when an absolute value of the charging and discharging current is less than a reference value, the data rejection unit fixing the first gain as a constant value, and, when the absolute value of the charging and discharging current is more than the reference value, the data rejection unit controlling the first gain as a function of the absolute value of the charge and discharge value.

9. The system of claim 8, with the reference value being equal to five amperes (A), and when the absolute value of the charging and discharging current is more than the reference value, the first gain $R_k$ being controlled as a function of $R_k = R_{k-1}(1+G_1(|i|-5))$, where $|i|5$ and $G_i$ is a constant.

10. The system of claim 4, with, when a dynamic of the charging and discharging current is not sensed, the data rejection unit fixing the first gain as a constant value, and when the dynamic of the charging and discharging current is sensed, the data rejection unit controlling the first gain correspondingly to a period for generating the dynamic of the charging and discharging current.

11. The system of claim 10, with, when the dynamic of the charging and discharging current is sensed, the first gain $R_k$ being controlled as a function of $R_k = R_{k-1}(1+G_{step} \cdot T_{steptime})$, where $T_{steptime}$ is a period for varying current and $G_{step}$ is a constant.

12. The system of claim 7, with the predictor predicting the first state variable $SOC_K$ and the second state variable $V_{Diff\_K}$ as a function of a state equation:

$$\begin{bmatrix} SOC_K \\ V_{Diff\_K} \end{bmatrix} = \begin{bmatrix} 1 & 0 \\ 0 & 1 - \dfrac{\Delta t}{C_{Diff} \cdot R_{Diff}} \end{bmatrix} \cdot \begin{bmatrix} SOC_{K-1} \\ V_{Diff\_K-1} \end{bmatrix} + \begin{bmatrix} \dfrac{\Delta t}{C_n} \\ \dfrac{\Delta t}{C_{Diff}} \end{bmatrix} \cdot i_{K-1}$$

where
$SOC_K$ is a state-of-charge predicted in the present state,
$SOC_{K-1}$ is a state-of-charge corrected in an earlier state,
$V_{Diff\_K}$ is a voltage applied to diffusion impedance of the present state,
$V_{Diff\_K-1}$ is a voltage applied to diffusion impedance corrected in the earlier state,
$C_{Diff}$ is a capacitance of diffusion impedance,
$R_{Diff}$ is a resistance of diffusion impedance,
$\Delta t$ is a temporal interval between the present state and the earlier state,
$i_{K-1}$ is an electric current flowing through the battery in the earlier state, and
$C_n$ is a rating capacitance of battery.

13. The system of claim 12, with the measurement unit predicting the battery terminal voltage, and generating a difference between a measured battery terminal voltage Vt and a predicted battery terminal voltage Vt as a function of an output equation:

$$Vt = OCV - Vdiff - Vr$$

where
Vt is a predicted terminal voltage of battery,
Vdiff is a diffusion impedance voltage, and
Vr is a voltage of internal resistor.

14. The system of claim 13, with the measurement unit generating the second gain $\overline{K}_k$ by using Equation:

$$\overline{K}_k = P_k(-)H_k^{[1]T}[H_k^{[1]}P_k(-)H_k^{[1]T}+R_k]^{-1}$$

where
$H_k^{[1]}$ is a linearized matrix generated by differentiating the output equation by the state variable,
$H_k^{[1]T}$ is an inverse matrix of the linearized matrix, and
$P_k(-)$ is a prediction covariance for estimation error of state variable.

15. The system of claim 9, with the predictor predicting the first state variable $SOC_K$ and the second state variable $V_{Diff\_K}$ as a function of a state equation:

$$\begin{bmatrix} SOC_K \\ V_{Diff\_K} \end{bmatrix} = \begin{bmatrix} 1 & 0 \\ 0 & 1 - \frac{\Delta t}{C_{Diff} \cdot R_{Diff}} \end{bmatrix} \cdot \begin{bmatrix} SOC_{K-1} \\ V_{Diff\_K-1} \end{bmatrix} + \begin{bmatrix} \frac{\Delta t}{C_n} \\ \frac{\Delta t}{C_{Diff}} \end{bmatrix} \cdot i_{K-1}$$

where
$SOC_K$ is a state-of-charge predicted in the present state,
$SOC_{K-1}$ is a state-of-charge corrected in the earlier state,
$V_{Diff\_K}$ is a voltage applied to diffusion impedance of the present state,
$V_{Diff\_K}$ is a voltage applied to diffusion impedance corrected in the earlier state,
$C_{Diff}$ is a capacitance of diffusion impedance,
$R_{Diff}$ is a resistance of diffusion impedance,
$\Delta t$ is a temporal interval between the present state and the earlier state,
$i_{K-1}$ is an electric current flowing through the battery in the earlier state, and
$C_n$ is a rating capacitance of battery.

16. The system of claim 15, with the measurement unit predicting the battery terminal voltage, and generating a difference between the battery terminal voltage Vt and the predicted battery terminal voltage Vt as a function of an output equation:

$$Vt = OCV - Vdiff - Vr$$

where
Vt is a terminal voltage of battery,
Vdiff is a diffusion impedance voltage, and
Vr is a voltage of internal resistor.

17. The system of claim 16, with the measurement unit generating the second gain $\overline{K}_k$ by using Equation:

$$\overline{K}_k = P_k(-)H_k^{[1]T}[H_k^{[1]}P_k(-)H_k^{[1]T}+R_k]^{-1}$$

where
$H_k^{[1]}$ is a linearized matrix generated by differentiating the output equation by the state variable,
$H_k^{[1]T}$ is an inverse matrix of the linearized matrix, and
$P_k(-)$ is a prediction covariance for estimation error of state variable.

18. The system of claim 11, with the predictor predicting the first state variable $SOC_K$ and the second state variable $V_{Diff\_K}$ as a function of a state equation:

$$\begin{bmatrix} SOC_K \\ V_{Diff\_K} \end{bmatrix} = \begin{bmatrix} 1 & 0 \\ 0 & 1 - \frac{\Delta t}{C_{Diff} \cdot R_{Diff}} \end{bmatrix} \cdot \begin{bmatrix} SOC_{K-1} \\ V_{Diff\_K-1} \end{bmatrix} + \begin{bmatrix} \frac{\Delta t}{C_n} \\ \frac{\Delta t}{C_{Diff}} \end{bmatrix} \cdot i_{K-1}$$

where
$SOC_K$ is a state-of-charge predicted in the present state,
$SOC_{K-1}$ is a state-of-charge corrected in the earlier state,
$V_{Diff\_K}$ is a voltage applied to diffusion impedance of the present state,
$V_{Diff\_K}$ is a voltage applied to diffusion impedance corrected in the earlier state,
$C_{Diff}$ is a capacitance of diffusion impedance,
$R_{Diff}$ is a resistance of diffusion impedance,
$\Delta t$ is a temporal interval between the present state and the earlier state,
$i_{K-1}$ is an electric current flowing through the battery in the earlier state, and
$C_n$ is a rating capacitance of battery.

19. The system of claim 18, with the measurement unit predicting the battery terminal voltage, and generating a difference between the battery terminal voltage Vt and the predicted battery terminal voltage Vt as a function of an output equation:

$$Vt = OCV - Vdiff - Vr$$

where
Vt is a terminal voltage of battery,
Vdiff is a diffusion impedance voltage, and
Vr is a voltage of internal resistor.

20. The system of claim 19, with the measurement unit generating the second gain $\overline{K}_k$ by using Equation:

$$\overline{K}_k = P_k(-)H_k^{[1]T}[H_k^{[1]}P_k(-)H_k^{[1]T}+R_k]^{-1}$$

where
$H_k^{[1]}$ is a linearized matrix generated by differentiating the output equation by the state variable,
$H_k^{[1]T}$ is an inverse matrix of linearized matrix, and
$P_k(-)$ is a prediction covariance for estimation error of state variable.

21. The system of claim 1, with the information associated with the error generated from the measurement model being a variance of the error.

22. A simple method for more accurately determining a state-of-charge of a battery, comprising:
measuring a charging and discharging current flowing through a battery, temperature of the battery, and terminal voltage of the battery;
counting the charging and discharging current, and using a measurement model of the battery to make an estimate of the state-of-charge of the battery;
generating information associated with errors attributable to a measurement model of the battery, as a function of at least one of the battery temperature, the charging and discharging current, the state of charge, and a dynamic of the charging and discharging current; and making a correction of the estimated state-of-charge of the battery, using the measurement model and the information associated with the error to more accurately determine the state-of-charge of the battery.

23. The method of claim 22, with the measurement model comprising an internal resistor, a diffusion impedance, and an open circuit voltage (OCV), and with the counting and the estimate further comprising making an estimation of the state-of-charge and a diffusion impedance voltage applied to the diffusion impedance on a per-constant time basis by using the charging and discharging current.

24. The method of claim 23, with the generation of the information further comprising generating the information associated with the error, as a first gain, and with the correction of the state-of-charge further comprising predicting the battery terminal voltage, using the open circuit voltage associated with the estimation of the state of charge, a voltage applied to an internal resistor of the measurement model, and the diffusion impedance voltage, and generating a second gain using the first gain and a comparison between the predicted battery terminal voltage and the measured terminal voltage.

25. The method of claim 24, with the correction of the state-of-charge further comprising concurrently correction of the estimated state-of-charge and the diffusion impedance voltage using the second gain, and with the counting and making of the estimate further comprising setting a corrected state-of-charge and diffusion impedance voltage as an initial value, counting the charging and discharging current for a certain time, and making the estimate of the state-of-charge and the diffusion impedance voltage.

26. The method of claim 25, with the generation of the information further comprising fixing the first gain as a constant value when the state-of-charge is in a first region and controlling the first gain as a function of the state-of-charge when the state-of-charge is in a second region, and distinguishing the first region and the second region as a function of the state of charge.

27. The method of claim 26, with the first region being a region where the state-of-charge is more than 20%, and the second region being a region where a state-of-charge is less than 20%, and with, when the state-of-charge is in the second region, the first gain $R_k$ being controlled as a function of $R_k = R_{k-1}(1+G_{SOC}(0.2-SOC))$, where $SOC \leqq 0.2$ and $G_{SOC}$ is a proportional constant.

28. The method of claim 25, with the generation of the information further comprising fixing the first gain as a constant value when an absolute value of the charging and discharging current is less than a reference value, and controlling the first gain as a function of the absolute value of the charge and discharge value when the absolute value of the charging and discharging current is more than the reference value.

29. The method of claim 28, with the reference value being equal to five amperes (A), and when the absolute value of the charging and discharging current is more than the reference value, the first gain $R_k$ being controlled as a function of $R_k = R_{k-1}(1+G_i(|i|-5))$, with $|i| \geqq 5$ and $G_i$ is a constant.

30. The method of claim 25, with the generation of the information further comprising fixing the first gain as a constant value when a dynamic of the charging and discharging current is not sensed, and controlling the first gain correspondingly to a period for generating the dynamic of the charging and discharging current when the dynamic of the charging and discharging current is sensed.

31. The system of claim 30, with, when the dynamic of the charging and discharging current is sensed, the first gain $R_k$ being controlled as a function of $R_k = R_{k-1}(1+G_{step} \cdot T_{steptime})$, where $T_{steptime}$ is a period for varying current, and $G_{step}$ is a constant.

32. The method of claim 22, with the information associated with the error generated from the measurement model is a variance of the error.

33. A driving method of a battery management system, comprising:

measuring a charging and discharging current flowing through a battery, a temperature of the battery, and a terminal voltage of the battery;

counting the charging and discharging current, and generating an estimation of a state-of-charge of the battery in dependence upon a measurement model of the battery;

generating information associated with an error attributable to a measurement model of the battery, as a function of at least one of the battery temperature, the charging and discharging current, the state-of-charge, and a dynamic of the charging and discharging current; and correcting the estimate of the state-of-charge using the measurement model and the information associated with the error.

34. The method of claim 33, with the measurement model comprising an internal resistor, a diffusion impedance, and an open circuit voltage (OCV), and with the counting and making an estimate further comprising setting the state-of-charge as a first state variable and setting a diffusion impedance voltage applied to the diffusion impedance as a second state variable, and estimating the first and second state variables on a per-constant time basis by using the charging and discharging current.

35. The method of claim 34, with the generation of the information further comprising generating the information associated with the error, as a first gain, and with the correction of the state-of-charge further comprising predicting the battery terminal voltage by using the open circuit voltage associated with the estimated state of charge, a voltage applied to an internal resistor of the measurement model, and the diffusion impedance voltage, and generating a second gain by using the first gain and a comparison between the predicted battery terminal voltage and the measured terminal voltage.

36. The method of claim 35, with the generation of the information further comprising fixing the first gain as a constant value when the state-of-charge is in a first region and controlling the first gain as a function of the state-of-charge when the state-of-charge is in a second region, and distinguishing the first region and the second region as a function of the state of charge.

37. The method of claim 36, with the first region being a region where a state-of-charge of more than 20%, and the second region being a region where a state-of-charge of less than 20%, and with, when the state-of-charge is in the second region, the first gain $R_k$ being controlled as a function of $R_k = R_{k-1}(1+G_{SOC}(0.2-SOC))$, where $SOC \leqq 0.2$ and $G_{SOC}$ is a proportional constant.

38. The method of claim 35, with the generation of the information further comprising fixing the first gain as a constant value when an absolute value of the charging and discharging current is less than a reference value, and controlling the first gain as a function of the absolute value of the charge and discharge value when the absolute value of the charging and discharging current is more than the reference value.

39. The method of claim 38, with the reference value being equal to five amperes (A), and when the absolute value of the charging and discharging current is more than the reference value, the first gain $R_k$ being controlled as a function of $R_k=R_{k-1}(1+G_i(|i|-5))$, with $|i| \geq 5$ and $G_i$ is a constant.

40. The method of claim 35, with the generation of the information further comprising fixing the first gain as a constant value when a dynamic of the charging and discharging current is not sensed, and controlling the first gain correspondingly to a period for generating the dynamic of the charging and discharging current when the dynamic of the charging and discharging current is sensed.

41. The system of claim 40, with, when the dynamic of the charging and discharging current is sensed, the first gain $R_k$ being controlled as a function of $R_k=R_{k-1}(1+G_{step} \cdot T_{steptime})$, where $T_{steptime}$ is a period for varying current, and $G_{step}$ is a constant.

42. The method of claim 32, with the information associated with the error generated from the measurement model is a variance of the error.

\* \* \* \* \*